(12) United States Patent
Shao

(10) Patent No.: US 11,624,784 B2
(45) Date of Patent: Apr. 11, 2023

(54) ENERGY STORAGE CAPACITOR DEVICE AND STATE MONITORING CIRCUIT

(71) Applicant: Silergy Semiconductor Technology (Hangzhou) LTD, Hangzhou (CN)

(72) Inventor: Peng Shao, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 17/341,522

(22) Filed: Jun. 8, 2021

(65) Prior Publication Data

US 2021/0389379 A1 Dec. 16, 2021

(30) Foreign Application Priority Data

Jun. 12, 2020 (CN) .......................... 202010537208.2

(51) Int. Cl.
*G01R 31/3835* (2019.01)
*H01M 10/48* (2006.01)

(52) U.S. Cl.
CPC ........ *G01R 31/3835* (2019.01); *H01M 10/48* (2013.01)

(58) Field of Classification Search
None
See application file for complete search history.

(56) References Cited

U.S. PATENT DOCUMENTS

| 6,445,162 | B1 | 9/2002 | Mukainakano |
| 6,631,293 | B2 | 10/2003 | Lyden |
| 2006/0061922 | A1 | 3/2006 | Mihai et al. |
| 2007/0177417 | A1* | 8/2007 | Corulli ............. G11C 29/50016 365/145 |
| 2008/0001593 | A1* | 1/2008 | Odajima ............... G01R 31/396 324/123 R |
| 2010/0271035 | A1* | 10/2010 | Heo .................... G01R 31/3835 324/429 |
| 2021/0036540 | A1* | 2/2021 | Suljic ...................... H02J 7/345 |

* cited by examiner

*Primary Examiner* — Jas A Sanghera

(57) ABSTRACT

A state monitoring circuit is disclosed for monitoring health states of N energy storage capacitors in an energy-storage capacitor device, the energy-storage capacitor device including N channels, and each channel comprising one energy storage capacitor, where the state monitoring circuit is configured to: disconnect first terminals of the N energy storage capacitors from the energy-storage capacitor device one by one; and determine whether each of the N energy storage capacitors is abnormal in accordance with a voltage at the first terminal of a corresponding one of the energy storage capacitors, where N is a positive integer.

8 Claims, 4 Drawing Sheets

ENERGY STORAGE CAPACITOR DEVICE AND STATE MONITORING CIRCUIT

RELATED APPLICATIONS

This application claims the benefit of Chinese Patent Application No. 202010537208.2, filed on Jun. 12, 2020, which is incorporated herein by reference in its entirety.

FIELD OF THE INVENTION

The present invention generally relates to the field of power electronics, and more particularly to energy-storage capacitor devices and associated state monitoring circuits.

BACKGROUND

Abnormal health states of an energy storage capacitor can include two types. The first type is that the energy storage capacitor is open-circuited. When an open circuit of energy storage capacitor is caused by the damage to equivalent series resistor ESR of the energy storage capacitor, the abnormal capacitor can be naturally disconnected, and no additional treatment may be required. The second type is that the energy storage capacitor is short-circuited. When a short circuit of energy storage capacitor is caused by the damage to equivalent series resistor ESR of the energy storage capacitor, this can seriously endanger operation of the circuit. Therefore, reasonable health management for the energy storage capacitor should be adopted, in order to prevent occurrence of such abnormal health states.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Figure 1:
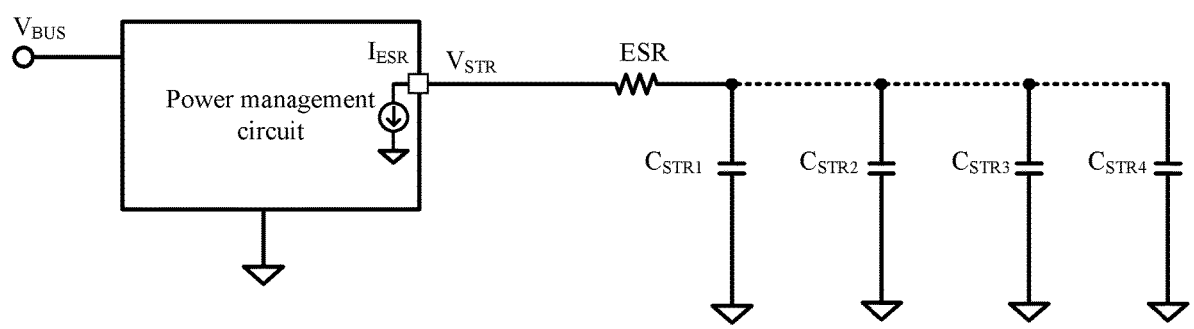
FIG. 1 is a schematic block diagram of an example state monitoring circuit for an energy storage capacitor.

Referring now to FIG. 1, shown is a schematic block diagram of a state monitoring circuit for an energy storage capacitor. When the circuit system is powered, a power management circuit may receive input voltage $V_{BUS}$, and can charge capacitors $C_{STR1}$-$C_{STR4}$ by performing the function of boost conversion. When the circuit system is powered off, the power stored in capacitors $C_{STR1}$-$C_{STR4}$ can be provided to subsequent circuits by performing the function of buck conversion in the power management circuit through input $V_{BUS}$. In this example, the power management circuit is bidirectional. This solution determines the health states of the capacitor by detecting equivalent series resistance ESR of the energy storage capacitor.

Figure 2:
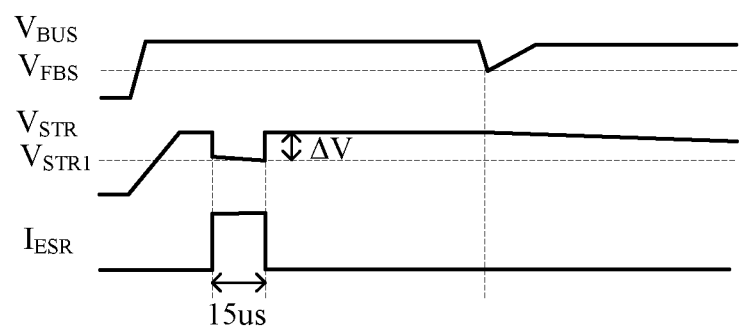
FIG. 2 is a waveform diagram of an example state monitoring circuit for an energy storage capacitor.

Referring now to FIG. 2, shown is a waveform diagram of an example state monitoring circuit for an energy storage capacitor. In this example, when the power management circuit begins to detect resistor ESR, pull-down current $I_{ESR}$ of 15 us may be generated internally. If 15 us is set to be much shorter than the discharge time of capacitor $C_{STR1}$, voltage $V_{STR1}$ across capacitor $C_{STR1}$ can be regarded as a constant value. Therefore, the value of resistor ESR is equal to $\Delta V/I_{ESR}$, where $\Delta V=V_{STR}-V_{STR1}$, and $V_{STR1}$ is a voltage across capacitor $C_{STR1}$. If the calculated value of resistor ESR is greater than or less than a threshold value that is set to be an abnormal value for equivalent series resistor ESR in the power management circuit, equivalent series resistance ESR can be determined to be triggered by mistake.

The disadvantage of this solution is that when equivalent series resistance ESR is found to be falsely triggered, the power management circuit can disconnect capacitor $C_{STAR}$ from the circuit by an internal switch, and the power storage management function can be terminated. In addition, when multiple capacitors are connected in parallel, equivalent series resistance ESR of each capacitor may not be detected, such that abnormal capacitors may not be accurately detected and disconnected.

Figure 3:
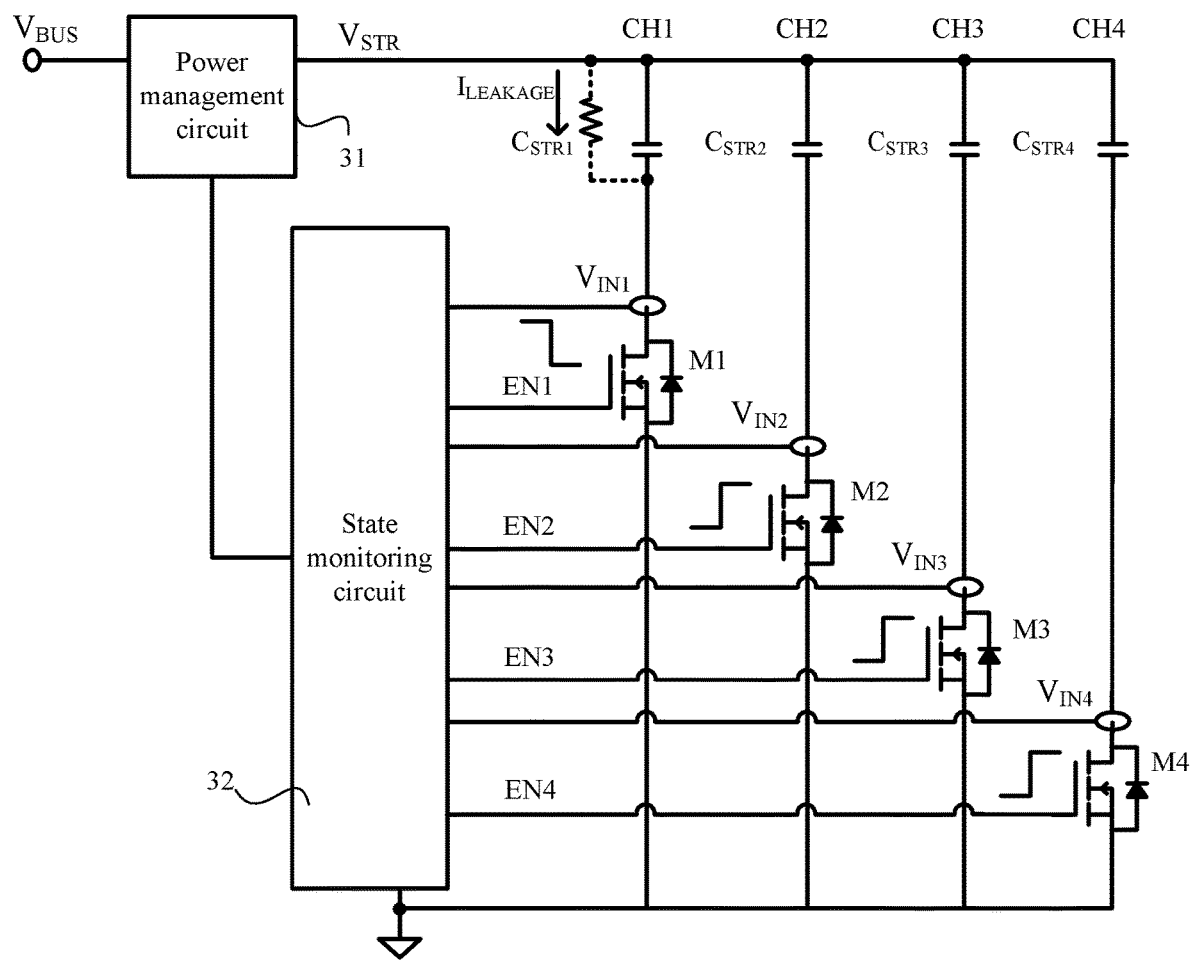
FIG. 3 is a schematic block diagram of an example energy-storage capacitor device, in accordance with embodiments of the present invention.

Referring now to FIG. 3, shown is a schematic block diagram of an example energy-storage capacitor device, in accordance with embodiments of the present invention. In this particular example, the energy-storage capacitor device can include N channels CH1-CHN connected in parallel. Each channel can include an energy storage capacitor, and N energy storage capacitors $C_{STR1}$-$C_{STRN}$ can be coupled in parallel between energy storage voltage $V_{STR}$ and a reference ground, where N is a positive integer (e.g., N is equal to 4 here). The first terminals of capacitors $C_{STR1}$-$C_{STR4}$ can connect, and energy storage voltage $V_{STR}$ may be generated at the first terminals of capacitors $C_{STR1}$-$C_{STR4}$. The energy storage capacitor device can also include power management circuit 31. When the energy-storage capacitor device is powered, power management circuit 31 may receive input voltage $V_{BUS}$, and can charge capacitors $C_{STR1}$-$C_{STRN}$ by performing the function of internal boost conversion. When the energy-storage capacitor device is powered off, power management circuit 31 can provide the power stored in capacitors $C_{STR1}$-$C_{STRN}$ to subsequent circuits by performing the function of internal buck conversion through input $V_{BUS}$ reversely. In this example, the power conversion of power management circuit 31 is bidirectional. In this way, the data residing in the buffer can be written to a flash memory, in order to reduce data loss.

In order to monitor the health states of the energy storage capacitor, and to prevent damage to the equivalent series resistor of the energy storage capacitor from causing an open circuit or short circuit of the energy storage capacitor, the energy storage capacitor device can also include state monitoring circuit 32. If N=1, only one channel CH1 may be provided, and channel CH1 can include energy storage capacitor $C_{STR1}$. State monitoring circuit 32 can effectively disconnect channel CH1 by cutting off a second terminal of energy storage capacitor $C_{STR1}$ during a detection period. During the period when channel CH1 is cut off, the second terminal of energy storage capacitor $C_{STR1}$ can be detected, in order to obtain detection voltage $V_{IN1}$. In this way, whether energy storage capacitor $C_{STR1}$ is abnormal can be determined according to detection voltage $V_{IN1}$. When energy storage capacitor $C_{STR1}$ is determined to be in an abnormal state, channel CH1 may remain cut off. When energy storage capacitor $C_{STR1}$ is determined to be in a normal state, channel CH1 can be cut off for predetermined time Tth, and then be conductive. In addition, detection voltage $V_{IN1}$ at the second terminal of energy storage capacitor $C_{STR1}$ can be obtained within each predetermined time Tth, in order to perform current limiting control.

If energy-storage capacitor device includes N channels CH1-CHN, state monitoring circuit 32 can disconnect second terminals of energy storage capacitors $C_{STR1}$-$C_{STRN}$ one by one during the detection period to accordingly cut off N channels CH1-CHN one by one. During the period when each channel is cut off, the second terminal of the energy storage capacitor in the corresponding channel can be detected, in order to obtain the corresponding detection voltage. Whether the energy storage capacitor in the corresponding channel is abnormal can be determined according to the corresponding detection voltage. When the energy storage capacitor in the corresponding channel is determined to be in an abnormal state, the corresponding channel may remain. When the energy storage capacitor in the corresponding channel is determined to be in a normal state, the corresponding channel can be cut off for predetermined time Tth, and then may be conductive. In addition, the corresponding detection voltage at the second terminal of the corresponding energy storage capacitor can be obtained within each predetermined time Tth, in order to perform current limiting control.

In one embodiment, the second terminal of energy storage capacitor $C_{STRN}$ can connect to the reference ground through switch MN, in order to control channel CHN to be cut off or conductive. State monitoring circuit 32 can control channels CH1-CHN to be cut off or conductive through switches M1-MN, in order to control channels CHN-CHN to be cut off one by one. In this embodiment, N switches M1-MN are configured to be located in state monitoring circuit 32.

In this embodiment, state monitoring circuit 32 can disconnect channels CH1-CHN one by one by sending commands EN1-ENN in one detection period. Further, commands EN1-ENN can be set as low-level signals to control switches M1-MN to be turned off so as to cut off channels CH1-CHN respectively. For example, command ENN can control switch MN connected in series with energy storage capacitor $C_{STRn}$ to be turned off so as to cut off channel CHN. Within predetermined time Tth when channel CHN is cut off, detection voltage $V_{INN}$ at the second terminal of energy storage capacitor $C_{STRN}$ can be detected. When detection voltage $V_{INN}$ is greater than first threshold Vth, energy storage capacitor $C_{STRN}$ can be determined to be in the abnormal state. Here, predetermined time Tth is greater than the charging time for energy storage capacitor $C_{STRn}$ to be charged to first threshold Vth with a maximum leakage current, in order to ensure the accuracy of detection.

When the energy storage capacitor device operates normally, all channels CH1-CHN may remain in the conducting states, and multiple energy storage capacitors $C_{STR1}$-$C_{STRN}$ can be grounded. Also, detection voltage $V_{IN1}$-$V_{INN}$ at second terminals of energy storage capacitors $C_{STR1}$-$C_{STRN}$ can be 0V. In this way, all energy storage capacitors $C_{STR1}$-$C_{STRN}$ can be charged to energy storage voltage $V_{STR}$. Once channel CHN is cut off, detection voltage $V_{INN}$ at the second terminal of energy storage capacitor $C_{STRN}$ may remain at a low voltage due to the hysteresis of the capacitor voltage.

When the energy storage capacitor device operates abnormally, a resistor can be formed and be connected in parallel with one energy storage capacitor in the corresponding channel. For example, the resistor can connect in parallel with energy storage capacitor $C_{STR1}$ in channel CH1, and leakage current $I_{LEAKAGE}$ may flow through the second terminal of capacitor $C_{STR1}$, as shown by the dotted line in FIG. 3. Energy storage capacitor $C_{STR1}$ can be reversely charged, and detection voltage $V_{IN1}$ at the second terminal of energy storage capacitor $C_{STR1}$ can gradually increase. Within predetermined time Tth set by the system, when detection voltage $V_{IN1}$ rises to threshold Vth, energy storage capacitor $C_{STR1}$ can be determined to have excessive leakage, such that energy storage capacitor $C_{STR1}$ can be determined to be abnormal and invalid. When detection voltage $V_{IN1}$ does not rise to threshold Vth within predetermined time Tth, energy storage capacitor $C_{STR1}$ can be determined to be normal.

Figure 4:
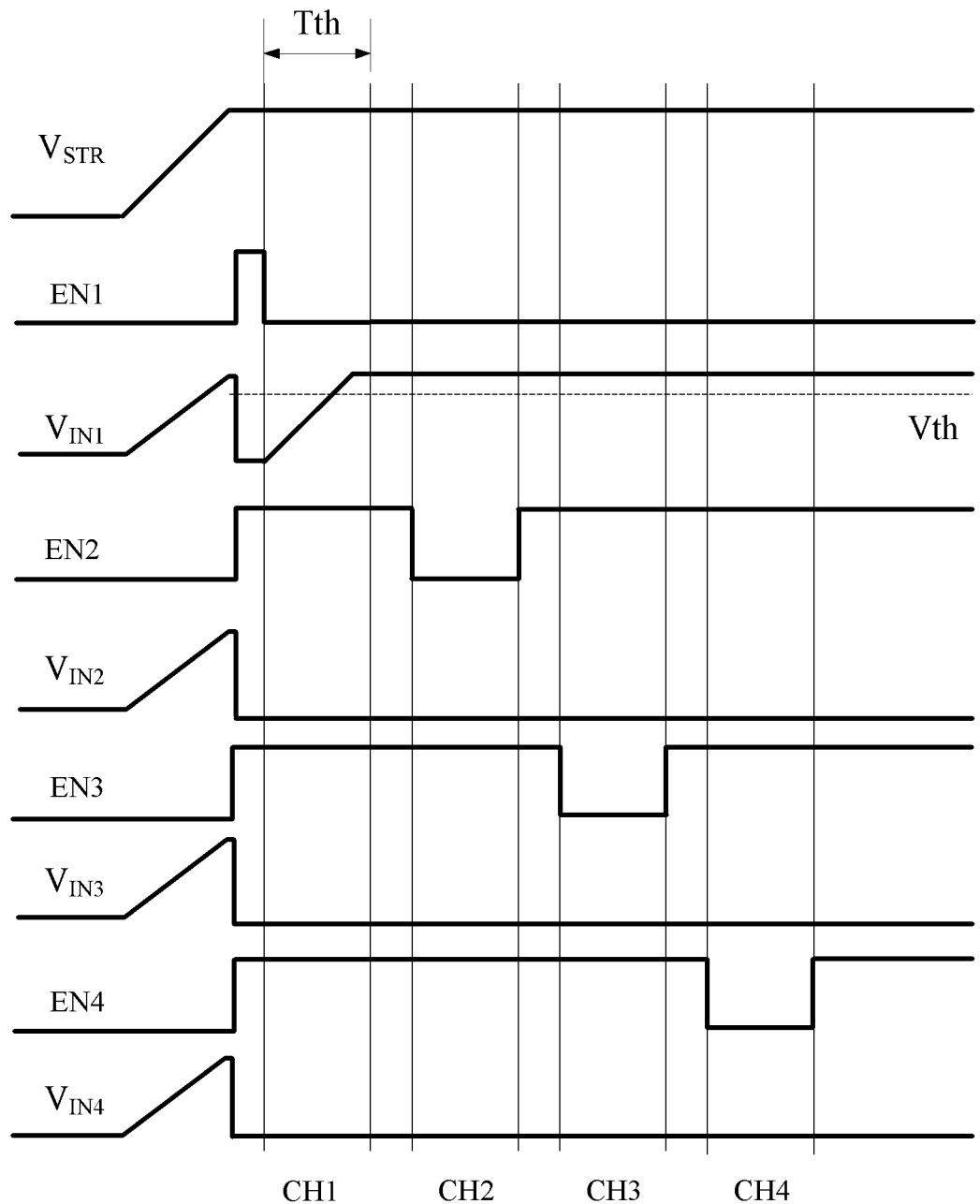
FIG. 4 is a waveform diagram of an example state monitoring process of an example energy-storage capacitor device, in accordance with embodiments of the present invention.

Referring now to FIG. 4, shown is a waveform diagram of an example state monitoring process of an example energy-storage capacitor device, in accordance with embodiments of the present invention. In this particular example, 4 channels are included, and when the energy-storage capacitor device is powered normally, state monitoring circuit 32 simultaneously generates valid commands EN1-EN4 (e.g., a high level is valid), and all 4 channels are conductive. Energy storage capacitors $C_{STR1}$-$C_{STR4}$ can be charged, and voltages $V_{IN1}$-$V_{IN4}$ at the second terminals of energy storage capacitors $C_{STR1}$-$C_{STR4}$ may all be 0V.

When command EN1 is inactive (e.g., a low level), and commands EN2-EN4 are active (e.g., high levels), switch M1 can be turned off, and channel CH1 cut off. State monitoring circuit 32 can obtain detection voltage $V_{IN1}$ at the second terminal of energy storage capacitors $C_{STR1}$ within predetermined time Tth. If detection voltage $V_{IN1}$ is greater than threshold Vth, energy storage capacitor $C_{STR1}$ can be determined to be abnormal. Also, command EN1 may remain low, in order to disconnect energy storage capacitor $C_{STR1}$ on channel CH1 from the power management circuit, as shown in FIG. 4. If detection voltage $V_{IN1}$ is less than threshold Vth, energy storage capacitor $C_{STR1}$ can be determined to be normal, and command EN1 can transition from a low level to a high level after predetermined time Tth. As such, energy storage capacitor $C_{STR1}$ after being detected can be reconnected to power management circuit 31.

When command EN2 is inactive (e.g., a low level), and commands EN1, EN3-EN4 are active (e.g., high levels), switch M2 can be turned off, and channel CH2 cut off. State monitoring circuit 32 can obtain detection voltage $V_{IN2}$ at the second terminal of energy storage capacitors $Cs_{TR2}$ within predetermined time Tth. If detection voltage $V_{IN2}$ is greater than threshold Vth, energy storage capacitor $Cs_{TR2}$ can be determined to be abnormal, and command EN2 may remain low to disconnect energy storage capacitor $Cs_{TR2}$ on channel CH2 from the power management circuit. If detection voltage $V_{IN2}$ is less than threshold Vth, energy storage capacitor $C_{STR2}$ can be determined to be normal, and command EN2 can go from a low level to a high level after predetermined time Tth, such that energy storage capacitor $C_{STR2}$ after being detected can be reconnected to power management circuit 31.

Channels CH3 and CH4 can monitor the health states of energy storage capacitors $C_{STR3}$ and $C_{STR4}$ according to the above-mentioned detection steps. The capacitors that are determined to be abnormal can be disconnected from power management circuit 31, and the capacitors that are determined to be normal can be reconnected to power management circuit 31. In this example, threshold Vth can be determined by the capacitance of the energy storage capacitor, predetermined time Tth, and maximum leakage current $I_{LEAKAGE\_MAX}$ of the energy storage capacitor. As shown, if energy storage capacitor $C_{STR1}$ is abnormal, energy storage capacitor $C_{STR1}$ can be reversely charged by leakage $I_{LEAKAGE}$, and detection voltage $V_{IN1}$ at the second terminal of energy storage capacitor $C_{STR1}$ may gradually rise. In addition, detection voltage $V_{IN1}$ can be expressed as below in Formula (1).

$$V_{IN1} = \frac{I_{LEAKAGE} \times Tth}{C_{STR1}} \quad (1)$$

For example, threshold Vth can be set to determine whether the energy storage capacitor is abnormal, and may be expressed as below in Formula (2).

$$Vth = \frac{I_{LEAKAGE\_MAX} \times Tth}{C_{STRn}} \quad (2)$$

Here, $I_{LEAKAGE\_MAX}$ is the maximum leakage current that the energy storage capacitor may not exceed, which can be defined by corresponding capacitor specifications. Predetermined time Tth may be defined by the energy-storage capacitor device, or can be calculated in accordance with threshold Vth. Predetermined time Tth can be expressed as below in Formula (3).

$$Tth = \frac{Vth \times C_{STRn}}{I_{LEAKAGE\_MAX}} \quad (3)$$

In particular embodiments, an energy storage capacitor device may include a plurality of energy storage capacitors coupled in parallel, and can perform detection of the health states of the energy storage capacitors, respectively, and accurately detect capacitors that are abnormal. The detection period can be set by the state monitoring circuit. During the detection period, the N channels can be cut off one by one, and the detection voltage at the second terminal of the corresponding energy storage capacitor can be obtained during the period when the corresponding channel is cut off. Whether the energy storage capacitor is abnormal can be determined in accordance with the corresponding detection voltage. If the energy storage capacitor is abnormal during operation, the abnormal energy storage capacitor can be disconnected form the power management circuit, so as not to affect normal operation of the energy storage capacitor device.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A state monitoring circuit for monitoring health states of N energy storage capacitors in an energy-storage capacitor device, the energy-storage capacitor device comprising N channels, and each channel comprising one energy storage capacitor, wherein the state monitoring circuit is configured to:
   a) disconnect first terminals of the N energy storage capacitors from the energy-storage capacitor device one by one;
   b) determine whether each of the N energy storage capacitors is abnormal in accordance with a voltage at the first terminal of a corresponding one of the energy storage capacitors, wherein N is a positive integer;
   c) wherein each of the N channels is cut off for a predetermined time, and the predetermined time is greater than a charging time for the energy storage capacitor to be charged to a first threshold with a maximum leakage current;
   d) wherein during the predetermined time, when the voltage at the first terminal of the corresponding one of the energy storage capacitors is greater than the first threshold, the corresponding one of the energy storage capacitors is determined to be abnormal; and
   e) wherein the first threshold is determined by a capacitance value of the energy storage capacitor, the predetermined time, and the maximum leakage current of the energy storage capacitor.

2. The state monitoring circuit of claim 1, wherein the first terminal of each of the N energy storage capacitor is coupled to a reference ground through a switch.

3. The state monitoring circuit of claim 2, wherein the state monitoring circuit is configured to control a corresponding switch to be turned off so as to disconnect a corresponding one of the first terminals of N energy storage capacitors from the energy-storage capacitor device.

4. The state monitoring circuit of claim 1, wherein when the energy storage capacitor in a corresponding one of channels is determined to be in an abnormal state, the corresponding one of channels continues to be cut off.

5. An energy-storage capacitor device, comprising the state monitoring circuit of the claim 1, and further comprising N switches that are each coupled between a corresponding one of the energy storage capacitors and a reference ground, wherein N is a positive integer.

6. The energy-storage capacitor device of claim 5, wherein the N switches are configured to be located in the state monitoring circuit.

7. The energy-storage capacitor device of claim 6, further comprising a power management circuit configured to:
   a) charge the N energy storage capacitors through an input voltage when the energy-storage capacitor device is powered; and
   b) provide power stored in the N energy storage capacitors to a power terminal of the input voltage when the energy-storage capacitor device is powered off.

8. A state monitoring circuit for monitoring health states of N energy storage capacitors in an energy-storage capacitor device, the energy-storage capacitor device comprising N channels, and each channel comprising one energy storage capacitor, wherein the state monitoring circuit is configured to:
   a) disconnect first terminals of the N energy storage capacitors from the energy-storage capacitor device one by one;
   b) determine whether each of the N energy storage capacitors is abnormal in accordance with a voltage at the first terminal of a corresponding one of the energy storage capacitors, wherein N is a positive integer;
c) wherein each of the N channels is cut off for a predetermined time, and the predetermined time is greater than a charging time for the energy storage capacitor to be charged to a first threshold with a maximum leakage current;
d) wherein during the predetermined time, when the voltage at the first terminal of the corresponding one of the energy storage capacitors is greater than the first threshold, the corresponding one of the energy storage capacitors is determined to be abnormal; and
e) wherein during the predetermined time, a current flowing through a corresponding one of N energy storage capacitors is obtained to perform current limiting control.

* * * * *